(12) United States Patent
Amar et al.

(10) Patent No.: US 6,642,879 B2
(45) Date of Patent: Nov. 4, 2003

(54) METHOD AND SYSTEM FOR POWERING DOWN AN ANALOG-TO-DIGITAL CONVERTER INTO A SLEEP MODE

(75) Inventors: Aryesh Amar, Nashua, NH (US); Philip Steiner, Nashua, NH (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/906,916

(22) Filed: Jul. 16, 2001

(65) Prior Publication Data

US 2003/0011499 A1 Jan. 16, 2003

(51) Int. Cl.[7] ................................................ H03M 1/12
(52) U.S. Cl. ....................................... 341/155; 713/324
(58) Field of Search ............................... 341/155, 122; 713/324, 323

(56) References Cited

U.S. PATENT DOCUMENTS

| | | | | |
|---|---|---|---|---|
| 5,294,928 A | * | 3/1994 | Cooper et al. ............... 341/142 |
| 5,422,807 A | * | 6/1995 | Mitra et al. .................. 364/184 |
| 5,619,204 A | * | 4/1997 | Byrne et al. ................. 341/155 |
| 5,714,955 A | * | 2/1998 | Reay et al. .................. 341/126 |
| 5,886,658 A | * | 3/1999 | Amar et al. ................. 341/155 |
| 5,914,681 A | * | 6/1999 | Rundel ........................ 341/135 |
| 6,057,795 A | * | 5/2000 | Suzuki ........................ 341/155 |
| 6,070,140 A | * | 5/2000 | Tran ............................ 704/275 |
| 6,072,417 A | * | 6/2000 | Staton ........................ 341/165 |
| 6,163,851 A | * | 12/2000 | Yamazoe et al. ........... 713/100 |

\* cited by examiner

*Primary Examiner*—Peguy Jeanpierre
(74) *Attorney, Agent, or Firm*—Steven Lin, Esq.

(57) ABSTRACT

A method and system for powering down an analog-to-digital converter ("ADC") into a sleep mode are disclosed. If the ADC receives a normal set of pulses for a serial clock signal of the ADC, a serial interface controller outputs converted data requested by a user through a serial interface. Also, if the ADC receives a sleep set of pulses for the serial clock signal, a state machine of the ADC powers down the ADC into a sleep mode in which at least parts of the ADC are operated at a reduced power consumption level. Furthermore, if the ADC is in the sleep mode and the ADC receives a wake-up set of pulses for the serial clock signal, the state machine powers back up the ADC from the sleep mode.

28 Claims, 8 Drawing Sheets

METHOD AND SYSTEM FOR POWERING DOWN AN ANALOG-TO-DIGITAL CONVERTER INTO A SLEEP MODE

BACKGROUND OF THE INVENTION

1. Technical Field

The present invention relates in general to an analog-to-digital converter, and, in particular, to a serial interface controller of a serial data interface for an analog-to-digital ("A/D") converter. Still more particularly, the present invention relates to a method and system for powering down an analog-to-digital converter into a sleep mode.

2. Description of the Related Art

Analog-to-digital converters ("ADCs") are used to convert an analog signal to a digital signal for digital processing and/or storage. ADCs are well known in the art and are used in a variety of applications. An ADC generally has an analog system and a digital system coupled to each other. The analog system includes at least a modulator for modulating the input analog signal. The analog system processes and converts an analog input signal to a digital output signal. The digital system processes and outputs the digital signal. The digital system typically has a digital logic system, a clock generator, a filter, and a serial port block coupled to each other. The filter operates to remove and/or reduce unwanted parts of the digital signal. The serial port block further has a serial data interface with a serial interface controller, which allows a serial device to be coupled to and communicate with the ADC.

Applications of the ADC may require acquiring data by taking samples or readings (e.g., monitoring of temperature or weight readings). Some applications require the taking of continuous samples or readings by a device interfaced with the serial port block, and the ADC continuously converts data in providing the samples or readings to be outputted to the interfaced device. Other applications require the taking of a single or few samples/readings at a time. In these applications, the user utilizes the interfaced device to read the converted data from the digital system of the ADC only some or part of the time (e.g., as the user requests the need for the data). The ADC, however, continuously converts input signals whether or not they are utilized or retrieved by the user through the interfaced device. As the ADC continuously converts input signals, the ADC continuously consumes power.

The present invention recognizes the need and desire to minimize or reduce the power consumption by an ADC when possible. Reduced or minimized power consumption for electronic devices or components, such as handheld or portable electronic devices, is a generally desired goal in saving overall power. One way of reducing or minimizing power would be to shut down the power supply for the ADC. Shutting down the power supply for the ADC poses various problems. One problem is that the power supply may be desired or needed to maintain at least some of the components of the ADC in a powered-on mode. Shutting down the power supply would entirely shut down all components of the ADC. Another problem is that after shut down of the power supply, the power supply needs to start up again, and various start-up problems may result. For example, the power supply for the ADC may require an elapsed time period before fully powering back on, and the ADC may not be able to timely power on again to take appropriate readings or samples by the interfaced device and/or user.

Also, configurations exist in which multiple chips are connected to the same power supply. In these configurations, all of the chips connected to the power supply would have to be powered down if the power supply were shut down. If one chip among the multiple chips has to stay powered on, then the remaining chips also have to stay on. Therefore, there is a need and desire to develop a system and/or way of selectively powering down each chip among the multiple chips connected to the same power source.

An extra pin for the ADC chip may be needed for switching between powering down and powering up the ADC chip. For example, this extra pin would be set to a high value to power down the ADC chip and set to a low value to power up the ADC chip. However, the present invention also recognizes the need and desire to minimize or reduce the number of pins on an ADC chip. Extra pins add to the space and cost of the ADC chip.

The present invention recognizes the desire or need for an ADC, which is able to power down when conversions and/or converted data are not desired or needed to be read or sampled by a user through an interfaced device. Furthermore, the present invention also recognizes the desire or need to not add an extra pin for controlling the power-down and power-up modes of the ADC. The present invention overcomes the problems and disadvantages in accordance with the prior art.

SUMMARY OF THE INVENTION

A method and system for powering down an analog-to-digital converter ("ADC") into a sleep mode are disclosed. If the ADC receives a normal set of pulses for a serial clock signal of the ADC, a serial interface controller outputs converted data requested by a user through a serial interface. Also, if the ADC receives a sleep set of pulses for the serial clock signal, a state machine of the ADC powers down the ADC into a sleep mode in which at least parts of the ADC are operated at a reduced power consumption level. Furthermore, if the ADC is in the sleep mode and the ADC receives a wake-up set of pulses for the serial clock signal, the state machine powers back up the ADC from the sleep mode.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

The present invention discloses a method and system for powering down an analog-to-digital converter into a sleep mode.

Figure 1:
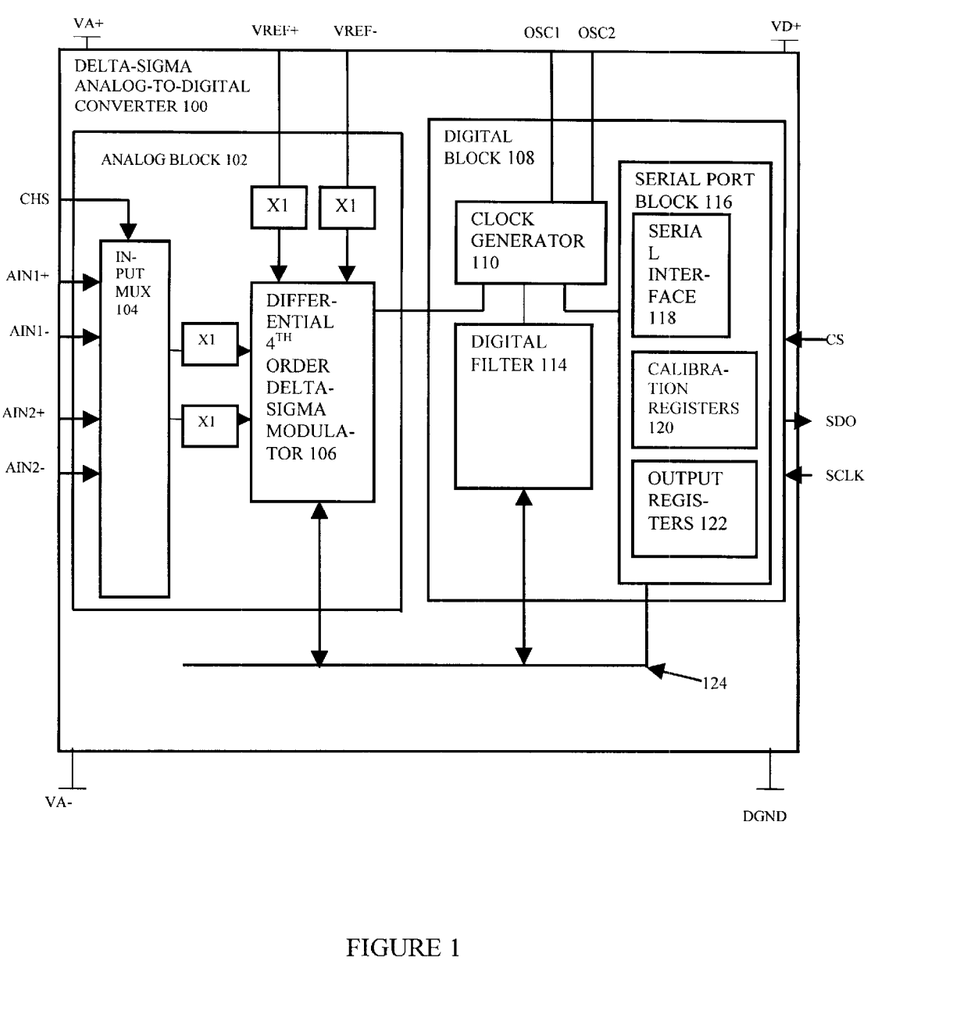
FIG. 1 is a block diagram of an exemplary delta-sigma analog-to-digital converter ("ADC"), which implements the present invention.

With reference now to FIG. 1, a block diagram of an exemplary delta-sigma analog-to-digital converter ("ADC") 100, which implements the present invention, is shown. ADC 100 has an analog block 102 and a digital block 108. ADC 100 is driven by a power supply with power supply voltages VA− and VA+ and another power supply driven between power supply voltage VD+ and power supply ground DGND. Analog block 102 includes at least an input multiplexer ("MUX") 104 and a differential fourth ($4^{th}$) order delta-sigma modulator ("delta-sigma modulator") 106, which are coupled together in series as shown in FIG. 1. Input MUX 104 receives two sets of inputs that may be converted from analog signals to digital signals for two respective input channels of ADC 100. One set of input signals includes AIN1+ and AIN1− signals. The other set of input signals includes AIN2+ and AIN2− signals. Input MUX 104 also has a channel select CHS pin coupled to the switching components of input MUX 104. Channel select CHS pin allows control in selecting between processing either the one or the other set of input signals. For example, ADC 100 may be set up so that if channel select CHS pin is set to a zero or low value, then AIN1+ and AIN1− signals are selected for conversion and processing. Alternatively, if channel select CHS pin is set to an one or high value, then AIN2+ and AIN2− signals are selected for conversion and processing.

For proper operation, delta-sigma modulator 106 is coupled to reference voltages VREF+ and VREF−. Delta-sigma modulator 106 generally transforms an input signal, which is limited in frequency band, into a one-bit digital output signal. Delta-sigma modulator 106 generally modulates the pulse density of the output signal based on the input signal. Delta-sigma modulator 106 is coupled to a serial port block 116 via a serial interface bus 124. As is well known in the art, delta-sigma modulator 106 typically includes at least integrating circuits, summation circuits, and a quantizer for modulating the output signal based on the input signal. Unity gain coarse/fine input buffers X1, which reduce the dynamic current on the corresponding pins, exist between input MUX 104 and delta-sigma modulator 106 and also between VREF+ and VREF− and delta-sigma modulator 106 as shown in FIG. 1.

Digital block 108 has at least a clock generator 110 and a digital filter 114 coupled together as shown in FIG. 1. Clock generator 110 generates the internal clock for proper operations of ADC 100. Oscillator clock pins OSC1 and OSC2 are coupled to clock generator 110. Digital filter 114 is coupled to serial port block 116 through serial interface bus 124. Serial port block 116 allows ADC 100 to serially interface its output to another device, such as a serial device, which is utilized by a user to read or use the output data. Serial port block 116 also includes a serial data interface 118, calibration registers 120, and output registers 122. Serial data interface 118 controls the outputting of the output data to the interfaced serial device when the user desires or needs to utilize and read the output data. Various other ADC chip pins are coupled to serial port block 116. The other ADC chip pins that are shown in FIG. 1 are: a chip select ("CS") pin which receives a CS signal that selects whether ADC 100 recognizes or blocks provided SCLK signals when a defined value is inputted at the CS pin (e.g., CS pin tied to a low value for ADC 100 to recognize the SCLK signals and CS pin tied to a high value for ADC 100 to block and ignore the SCLK signals); a serial data output ("SDO") pin which receives a SDO signal in which the SDO signal provides the output data that is ready to be read by a user when a SCLK signal is provided; a serial interface clock ("SCLK") pin used for inputting a serial interface clock signal (e.g., SCLK signal) into digital block 108 of ADC 100 to control when the output data is to be transferred and sent out to a serial interface device via serial interface 118 so that the output data is able to be used and read by a user. The present invention further uses and modifies the serial interface clock signal (e.g., SCLK signal) input into the SCLK pin to also control when ADC 100 is to enter into and wake up from the sleep mode.

Figure 2A:
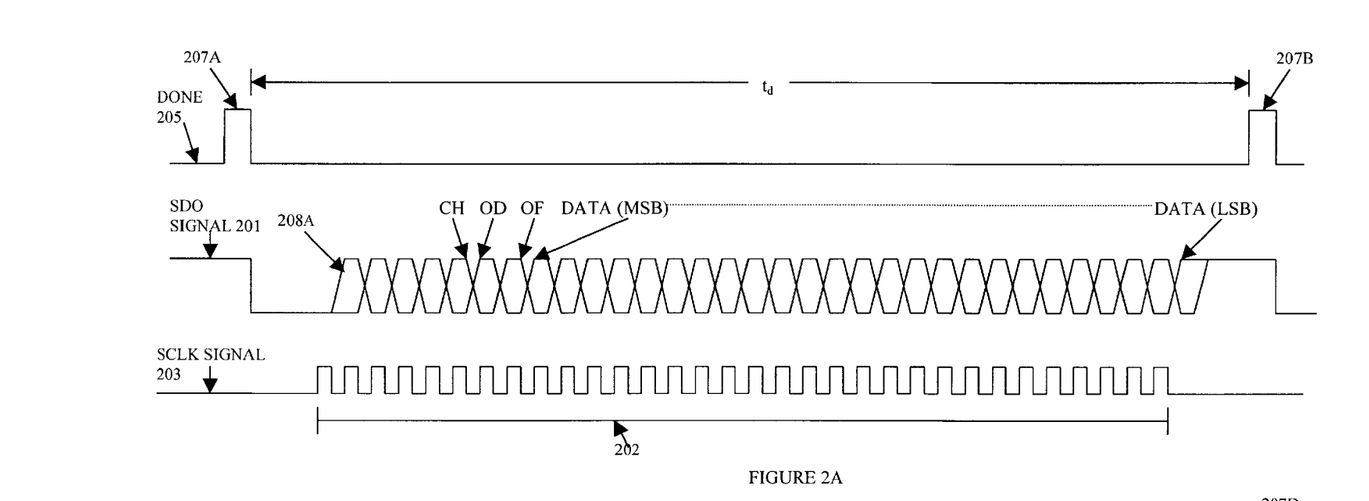
FIGS. 2A to 2C are timing diagrams of exemplary done signals, serial data out signals, serial clock signals, in which the timing diagrams are used to illustrate the principles of the present invention.
Figure 2B:
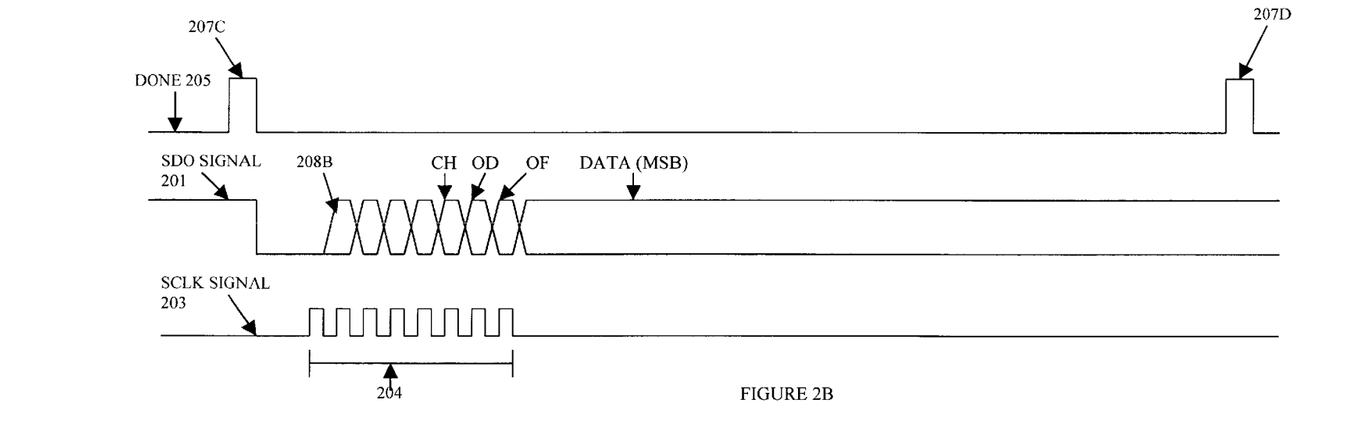
Figure 2C:
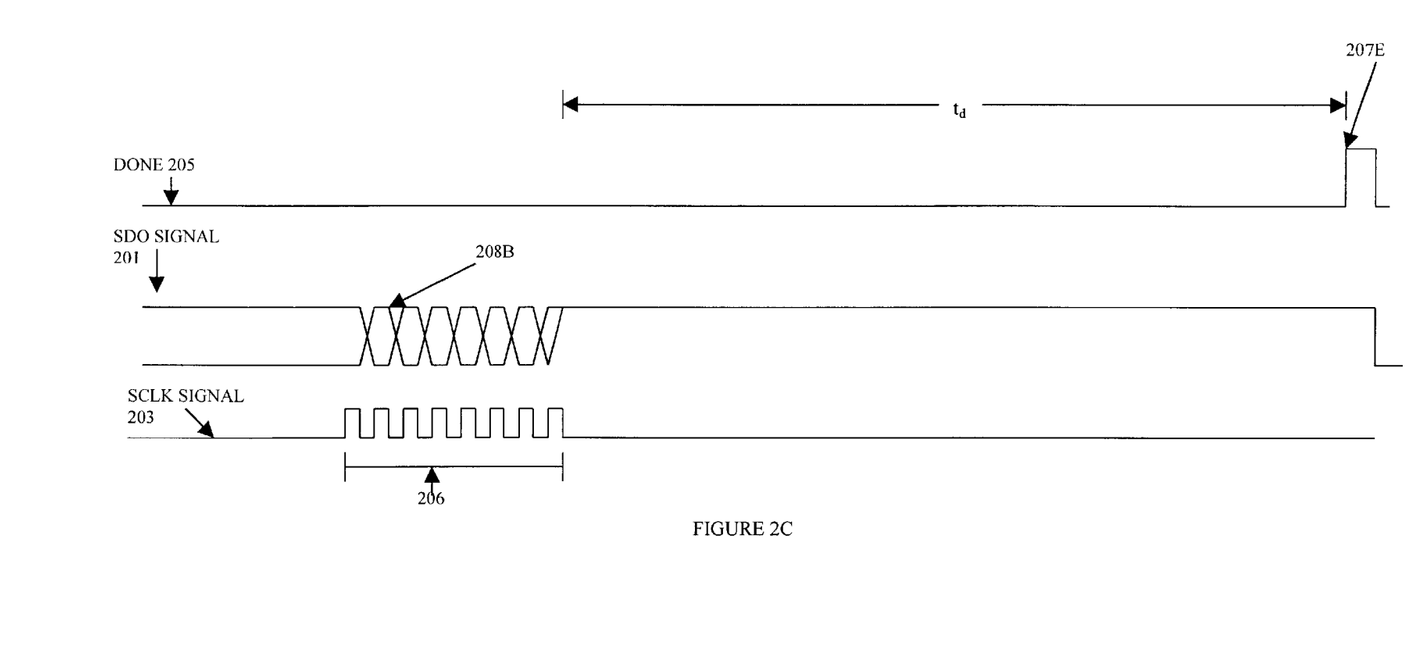

Referring now to FIGS. 2A to 2C, timing diagrams of exemplary done ("DONE") signals 205, serial data out ("SDO") signals 201, and serial clock ("SCLK") signals 203 are shown. The timing diagrams in FIGS. 2A to 2C are used to illustrate the principles of the present invention. CS pin may be an inverted CS pin in which a high signal applied to the CS pin causes ADC 100 to block recognition of SCLK signals (e.g., ADC 100 does not recognize SCLK signals). A low signal applied to CS pin causes ADC 100 to recognize SCLK signals (e.g., ADC 100 recognizes SCLK signals) when such signals are provided. ADC 100 begins to recognize SCLK signals at SCLK pin by setting CS pin to a low value. SCLK signal 203 is input into SCLK pin when the user wishes to read data or when ADC 100 is to be controlled to enter into or wake-up from the sleep mode. SCLK pulses for SCLK signal 203 or any other such pulsed signal is not provided to SCLK pin when the user does not wish to read data from ADC 100 or when ADC 100 is not to be controlled to operate in a particular mode. The user typically supplies SCLK signal 203 through the serial device or other such component or device. The present invention enables SCLK signal 203 to be utilized and provided in a way such that ADC 100 is operated in a particular or desired mode.

Referring to FIG. 2A, a set of timing diagrams illustrating ADC 100 operating in the normal mode is shown. As shown on the left side of the timing diagrams, SDO signal 201 is initially maintained at a high value and the state of serial data interface 118 is initialized to state 0 (see FIGS. 1 and 5). When data from digital block 108 is ready for reading by the user (e.g., digital block 108 has converted the data and the data is ready for reading by the user), then a high pulse 207A of DONE signal 205 (e.g., DONE=1) occurs. Digital block 108 generates and sends high pulse 207A of DONE signal 205 to serial port block 116 when the data is ready to be read. SDO signal 201 falls from the high value to a low value only when the state of serial data interface 118 is at state 0 and a high pulse, such as high pulse 207A, of DONE signal 205 occurs. SDO signal 201 then provides the data when an appropriate SCLK signal 203 begins at SCLK pin (e.g., data begins after or when the falling edge of the first pulse of SCLK signal 203 occurs).

In FIG. 2A, data block 208A shows the format of the data in SDO signal 201. The first several SDO bits of data block 208A are utilized to clear SDO flags. ADC 100 waits until after the first initial SCLK pulse before ADC 100 starts processing and outputting the SDO bits of data block 208A.

The first four SDO bits of data block 208A are initial values (e.g., either initial high values or initial low values). The fifth SDO bit of data block 208A is the channel ("CH") select flag for data block 208A. The value for the CH flag identifies from which set of input signals (either from the AIN1+ and AIN1− signal set or the AIN2+ and AIN2− signal set) the data was obtained, and this value is based on the signal applied at the CHS pin as discussed earlier. The sixth SDO bit is the oscillation detect ("OD") flag for data block 208A in which the OD flag is set to a value to indicate detection of oscillation. The seventh SDO bit is the overflow ("OF") flag. The OF flag is set to a value which indicates whether an overflow of data has occurred. The eighth through thirty-second SDO bits are the actual data values that are provided as the output data, starting with the most significant bit ("MSB") and ending with the least significant bit ("LSB"). As shown in FIG. 2A, serial data interface 118 receives a next SDO bit from data block 208A when a next falling edge of SCLK pulse occurs. The state of serial data interface 118 transitions to the next state each time a SCLK pulse of SCLK signal 203 occurs. In FIG. 2A, SCLK signal 203 has thirty-two (32) pulses. The next-to-last state 31 of serial data interface 118 is reached after thirty-one (31) pulses occur. When the thirty-second SCLK pulse occurs, then the state of serial data interface 118 automatically resets and returns to state 0 (see FIG. 5). As shown in FIG. 2A, SDO signal 201 automatically returns to the high value at the end of the update period $t_d$, and SDO signal 201 is maintained at the high value until the next DONE pulse of DONE signal 205 occurs.

When the user does not wish or request data from ADC 100, the user does not input or send, typically through an interface device, any SCLK signal 203. However, when the user wishes or requests to read the data from ADC 100, the user, typically through an interface device, sends SCLK signal 203 in the form of a normal set 202 of SCLK pulses, which has thirty-two pulses. ADC 100 is then normally operated to provide the data for the user to read. SDO signal 201 goes from the high value to a low value when the time high DONE pulse 207A occurs, and serial data interface 118 is at state 0. ADC 100 then recognizes normal set 202 of SCLK pulses input by the user. After the first initial pulse among normal set 202 of SCLK pulses occurs, ADC 100 begins to clear the SDO flags (e.g., first through seventh SDO bits). The clearing of the SDO flags were discussed in detail earlier. The eighth through thirty-second SDO bits are the data values provided as the output data, starting with the most significant bit ("MSB") and ending with the least significant bit ("LSB") as shown in FIG. 2A. The output and reading of the data at serial data interface 118 finishes, and the SDO signal 201 automatically returns to the high value and stays at the high value until the end of the update period $t_d$. Update period $t_d$ is a fixed interval of time when ADC 100 is operating normally and not in the sleep mode. In FIG. 2A, the update period $t_d$ spans the period of time between DONE pulses 207A and 207B, which is equivalent to a fixed number of pulses wherein each of the pulses is of a pre-determined length. Digital block 108 continues to convert data (e.g., provide data block 208A) regardless of whether or not the user decides to read the data.

With reference now to FIG. 2B, a set of timing diagrams illustrating ADC 100 entering into the sleep mode is shown. At the left side of this set of the timing diagrams, SDO signal 201 is shown back at its initial high value and the state of serial data interface 118 is again at initial state 0. When serial data interface 118 receives the next high DONE pulse 207C of DONE signal 205 from digital block 108 (e.g., digital block 108 has converted the data and the data is ready for reading by the user), SDO signal 201 falls from its initial high value to a low value. A sleep set 204 of SCLK pulses (e.g., having only eight pulses instead of thirty-two pulses) for SCLK signal 203 is utilized and input into SCLK pin, typically through an interface device or from a programmed command.

In FIG. 2B, when sleep set 204 of SCLK pulses is input at SCLK pin, ADC 100 begins processing through the initial four SDO bits of data block 208B, which are utilized to clear the SDO flags. ADC 100 then continues processing through the fifth, sixth, and seventh SDO bits. As stated earlier, fifth SDO bit is the channel ("CH") select flag for data block 208B. Sixth SDO bit is the oscillation-detect ("OD") flag for data block 208B while the seventh SDO bit is the overflow ("OF") flag. ADC 100 then proceeds to process the data bits starting at the MSB of data block 208B. However, ADC 100 continues to wait for a next SCLK pulse before further processing data bits beyond the MSB of data block 208B. In FIG. 2B, ADC 100 halts processing at the MSB of data block 208B when serial data interface 118 has the eighth pulse of sleep SCLK signal 204 has occurred to place serial data interface 118 at state 8. When this situation occurs and serial data interface 118 receives a next high DONE signal 207D from digital block 108, serial port block 116 signifies ADC 100 to power down into the sleep mode. ADC 100 is configured to enter into the sleep mode when the serial data interface 118 is at a predetermined state, such as state 8, and receives a high DONE pulse (e.g., high DONE pulse 207D).

Serial port block 116 changes a SLEEP value (see FIGS. 4A, 4B, 5 and 6) for ADC 100 from its initial low value to a high value to indicate that ADC 100 is to enter into the sleep mode. In the exemplary timing diagram of FIG. 2B, ADC 100 stops processing the data at the MSB of the data at the occurrence or falling edge of the eighth pulse of sleep set 204 (e.g., pulse that is pre-designated to trigger the sleep mode). The processing of serial data interface 118 stays at the MSB of data block 208B until a next pulse of a SCLK signal occurs (e.g., until the first SCLK pulse of SCLK signal 203 in FIG. 2C occurs). Also, the state of serial data interface 118 stays at state 8 until the occurrence of the next SCLK pulse. ADC 100 does not necessarily stop processing data block 208B at the MSB but stops at whichever bit follows the SCLK pulse that is pre-designated to trigger ADC 100 into the sleep mode (e.g., eighth SCLK pulse).

The sleep mode of the ADC 100 is a mode in which at least parts or ADC sub-systems (e.g., analog block 102, digital filter 114, etc.) are powered down and operated at a reduced power consumption level. The parts are switched to a sleep-mode or off-mode in which they are in a non-operational mode. For example, various parts or sub-systems, such as analog block 102, digital filter 114, etc., may consume three hundred (300) micro-amperes during normal operations and may consume ten (10) micro-amperes during the sleep-mode. Overall power that ADC 100 consumes may be reduced from one (1) milli-watt during normal operations to thirty (30) micro-watts when in the sleep mode.

Referring now to FIG. 2C, ADC 100 is already in the sleep mode, and a further set of timing diagrams illustrating ADC 100 waking up from the sleep mode is shown. At the left side of this set of timing diagrams, SDO signal 201 is maintained at the data bit at which ADC 100 stopped or halted processing at the time when ADC 100 went into the sleep mode (e.g., the MSB of data block 208B in FIG. 2B). SCLK signal 203 is now utilized and sent in the form of wake-up set 206 of SCLK pulses, which also has only eight pulses (e.g., another number of pulses that is pre-designated to wake up ADC 100 from the sleep mode) instead of thirty-two pulses. Wake-up set 206 of SCLK pulses is input into SCLK pin. Since ADC 100 has been in the sleep mode and the SLEEP value has been set to the high value, the inputting of wake-up set 206 of SCLK pulses at SCLK pin causes ADC 100 to again begin processing through the next eight SDO bits of data block 208B, which are the second most significant bit (e.g., MSB—1) to the ninth most significant bit (e.g., MSB—8) of the data. Also, the state of serial data interface 118 continues from state 8 and accordingly proceeds to states 9 to 15 (see FIGS. 1 and 5).

ADC 100 waits for the occurrence of the first initialization pulse of wake-up set 206. The next eight SDO pulses are processed over the first to eighth SCLK pulses of wake-up set 206 as shown in FIG. 2C. When serial data interface 118 reaches another predetermined state, state 15 (e.g., after the seventh SCLK pulse of wake-up set 206 occurs), ADC 100 checks to see whether the SLEEP value is a high value or a low value (see FIG. 5). If the SLEEP value is a high value at state 15 of serial data interface 118 (e.g., after the seventh SCLK pulse of wake-up set 206 occurs), then ADC 100 wakes up from the sleep mode. ADC 100 restarts the processing of data by resetting serial data interface 118 back at state 0 when the rising edge of the eighth SCLK pulse of wake-up set 206 occurs. In FIG. 2C, SDO signal 201 then automatically returns to its initial high value and stays at the high value until a next occurrence of a high DONE pulse 207E (e.g., until the end of the fixed update period $t_d$ which starts from the time ADC 100 woke up and ends at the occurrence of the high DONE pulse 207E). SCLK signal 203 returns to and stays at its initial low value. The SLEEP value is also set back to a low value. However, if the SLEEP value is a low value when serial data interface 118 reaches state 15 (see FIG. 5), then ADC 100 continues processing bits of the data block 208B provided that the data is being processed within a single update period $t_d$. Otherwise, an error, such as an out-of-synchronization or processing error, may have occurred in the processing of the data.

Figure 3:
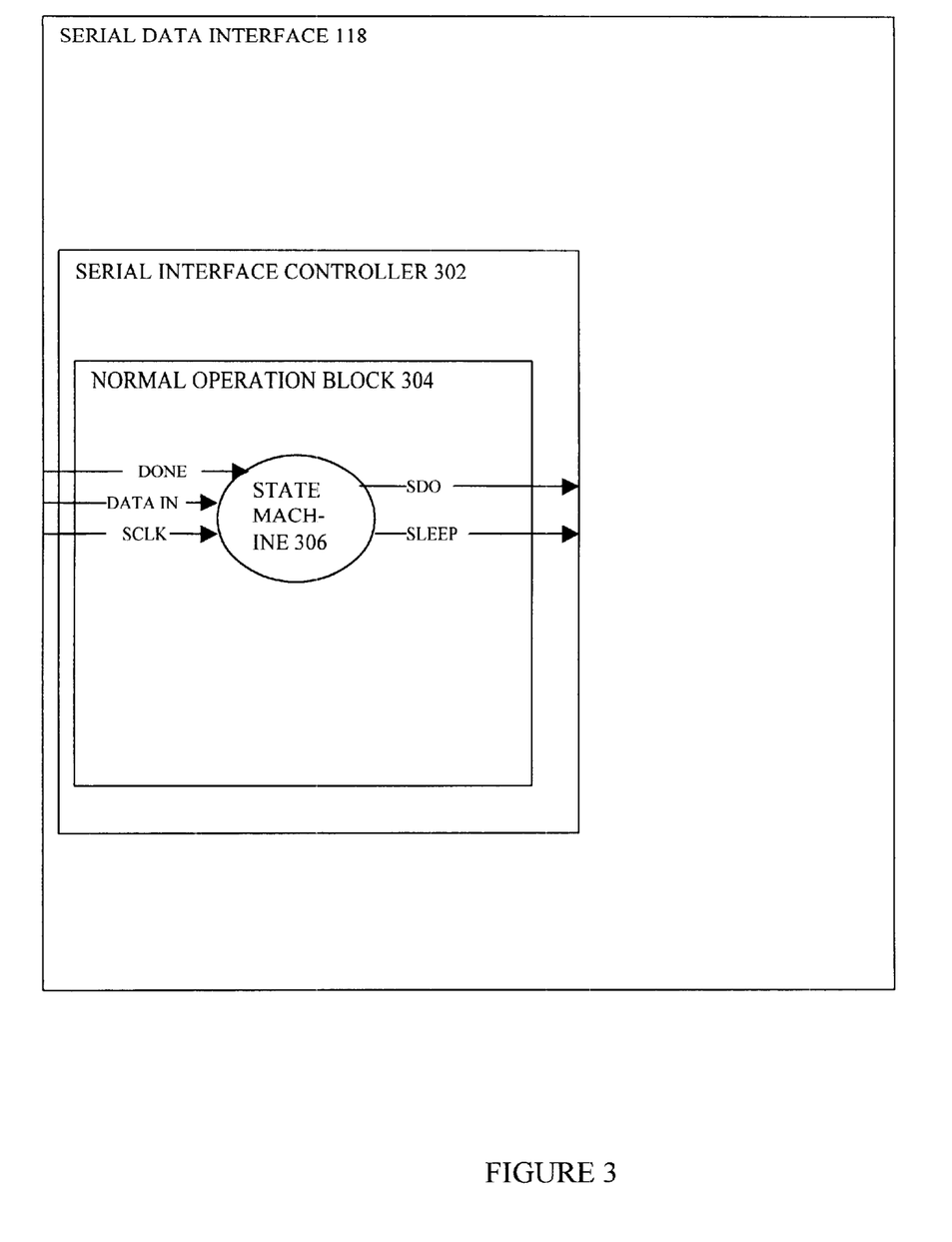
FIG. 3 is an exemplary serial data interface for the ADC of FIG. 1 in which the serial data interface has a serial interface controller with a state machine that implements the present invention.
Figure 5:
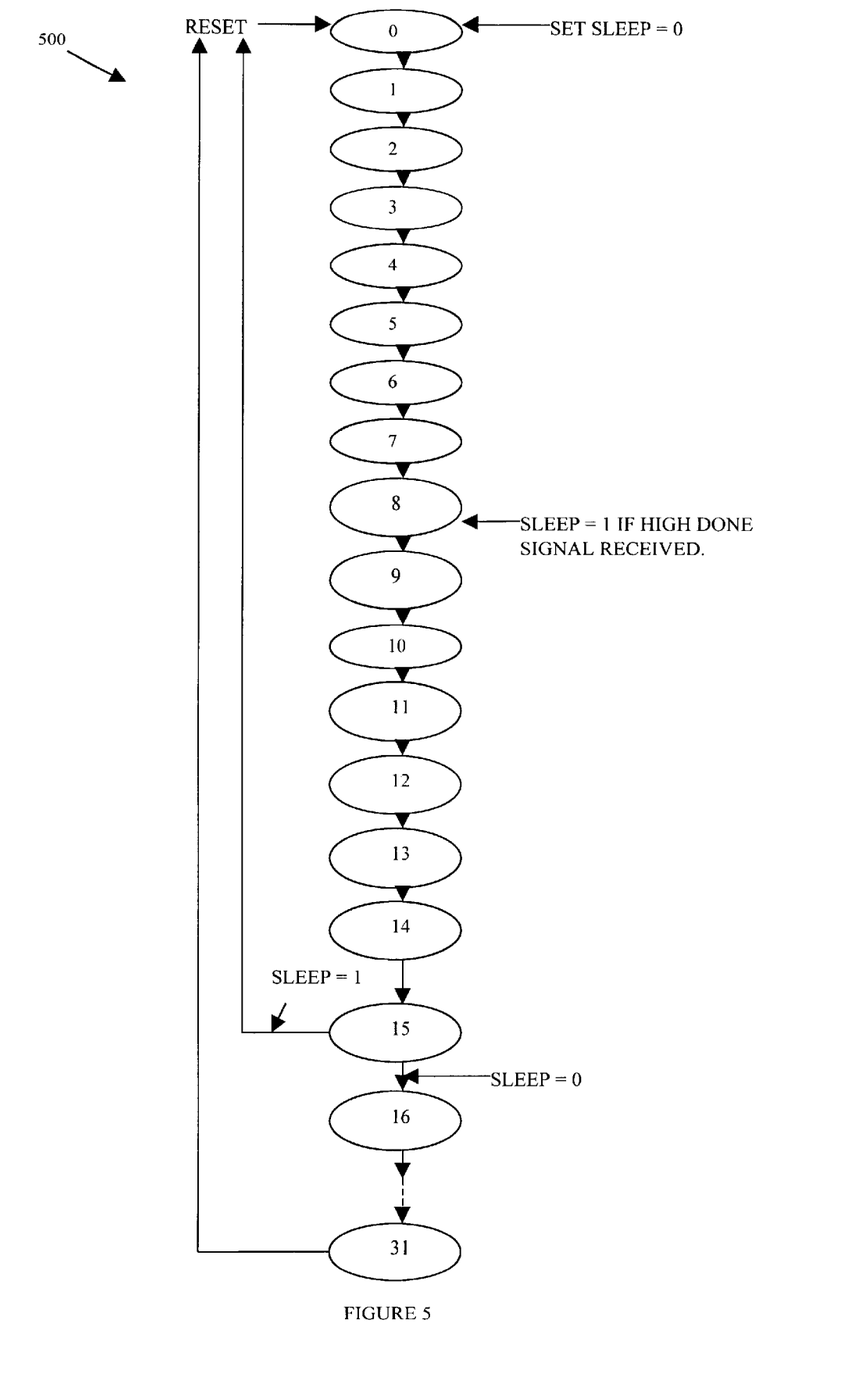
FIG. 5 is a state diagram for the state machine shown in FIG. 3, which is used to illustrate the principles of the present invention.

With reference now to FIG. 3, an exemplary serial data interface 118 for ADC 100 of FIG. 1 is shown. Serial data interface 118 has a serial interface controller 302. Serial interface controller 302 controls serial interface control operations of serial data interface 118. Serial interface controller 302 has a normal operation block 304. Normal operation block 304 contains a state machine 306, which may be a finite state machine ("FSM"). State machine 306 implements the method and algorithm of the present invention. State machine 306 operates at various states, such as states 0 to 31 as shown in FIG. 5.

FIG. 3 also shows the relationship of various pins and signal values of ADC 100 within normal operation block 304 of serial interface controller 302. Normal operation block 304 receives from digital block 108 via DATA IN pin a DATA IN signal that contains the information in the data blocks (e.g., data blocks 208A or 208B), which provides the data to be read by the user. Normal operation block 304 via SCLK pin also receives a serial clock signal, such as SCLK signal 203. As discussed earlier, ADC 100 operates and outputs converted data through the SDO signal via SDO pin to a user in a normal mode when SCLK pin receives normal set 202 of SCLK pulses. ADC 100 enters the sleep mode when SCLK pin receives sleep set 204 of SCLK pulses and wakes up from the sleep mode when SCLK pin later receives wake-up set 206 of SCLK pulses. Normal operation block 304 sets the SLEEP value. The SLEEP value for ADC 100, as discussed earlier, is set to a high value by state machine 306 to indicate when ADC 100 is to operate in the sleep mode and set to a low value by state machine 306 to indicate when ADC 100 is to operate in the normal mode. State machine 306 receives the DONE signal from digital filter 114. A high pulse in DONE signal signifies that digital filter 114 has finished the conversion of data and the data is ready for reading by the user. If serial data interface 118 receives a high pulse in DONE signal from digital filter 114 and the eight SCLK pulses of sleep set 204 have occurred (e.g., serial data interface 118 is at state 8 which has been pre-designated to trigger ADC 100 into the sleep mode), then ADC 100 powers down into the sleep mode by changing the SLEEP value from the low value to the high value.

Figure 4A:
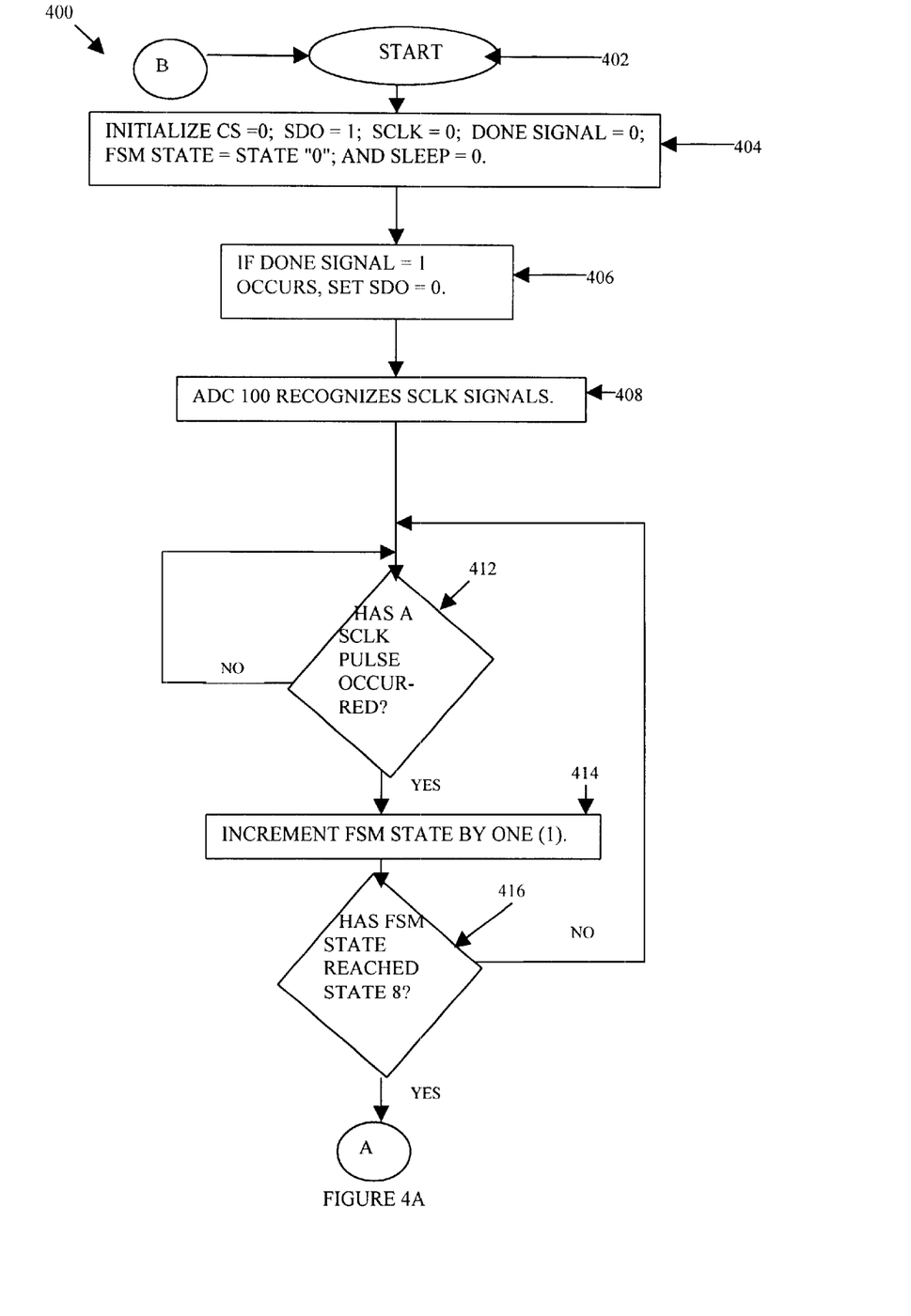
FIGS. 4A and 4B are flow charts of an exemplary state machine method for the state machine shown in FIG. 3 in accordance with the present invention.
Figure 4B:
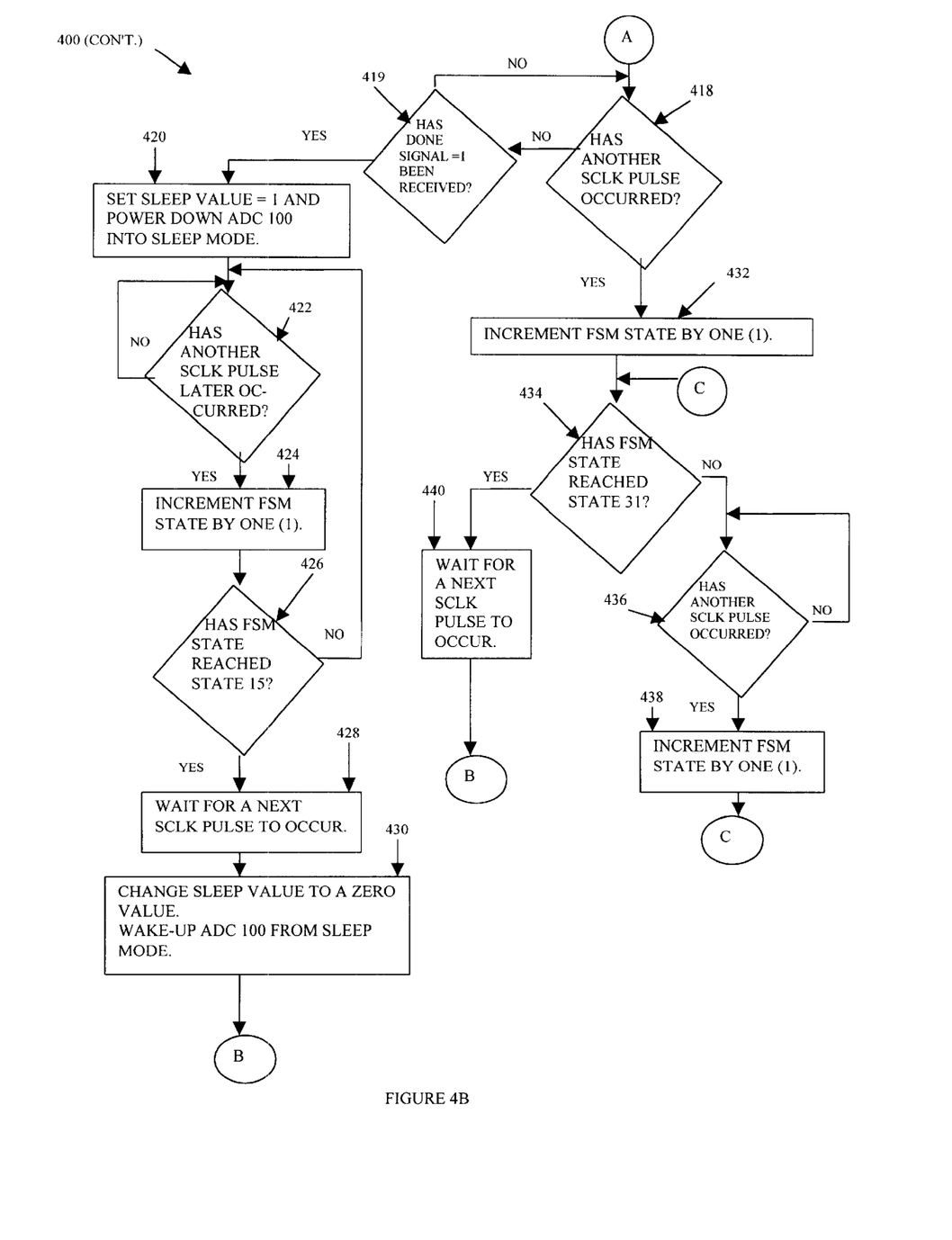

Referring now to FIGS. 4A and 4B, flow charts of an exemplary state machine method 400 for state machine 306 of FIG. 3 in accordance with the present invention is shown. Also, with reference to FIG. 5, a state diagram 500 for state machine 306 of FIG. 3 is also shown. FIGS. 4A, 4B, and 5 are now discussed together in exemplary detail to explain the workings and principles of the present invention. State machine 306 has components coupled together in a manner to provide serial interface control operations. Any suitable components, devices, or sub-systems are used for state machine 306 to implement state machine method 400 of FIGS. 4A and 4B.

State machine method 400 starts at block 402. State machine method 400 proceeds to block 404, which shows various values initialized as follows: Chip Select ("CS") value is set to zero (0), Serial Data Out ("SDO") value is set to one (1), Serial Clock ("SCLK") value is set to zero (0), Done Signal ("DONE SIGNAL") is set to a zero (0) value, the Finite State Machine State ("FSM STATE"), which is the state of state machine 306, is set to state 0, and the SLEEP value is set to zero (0). FIG. 5 also reflects SLEEP value being set equal to zero at state 0. Furthermore, CHS value is set to select either conversion of the AIN1+ and AIN1− inputs or the AIN2+ and AIN2− inputs. CS value is for an inverted chip select ("CS") pin, and CS value is set to a low value for ADC 100 to recognize SCLK signals. SDO value is based on SDO signal (e.g., SDO signal 201 of FIGS. 2A to 2C) that is input into SDO pin. Furthermore, SCLK value is based on SCLK signal (e.g., SCLK signal 203 of FIGS. 2A to 2C). As stated earlier, normal set 202 of SCLK pulses is input into SCLK pin when the user wishes to read data. Sleep set 204 of SCLK pulses is input into SCLK pin when ADC 100 is to enter into the sleep mode, and wakeup set 206 of SCLK pulses is input into SCLK pin when ADC 100 is to wake up from the sleep mode. SCLK signal 203 or any other such signal is not provided to SCLK pin when the user does not wish to read data from ADC 100 or when ADC 100 is not to operate in a particular mode.

Following block 404, block 406 shows that if a high DONE pulse of DONE signal 205 occurs, that is, DONE signal equals one (1) occurs, then SDO value is set equal to a zero (0) value. In other words, when FSM STATE of state machine 306 is at state 0 and a high DONE pulse has occurred, SDO signal 201 falls from its initial high value to a low value. State machine method 400 proceeds to block 408, which shows ADC 100 recognizing SCLK signals (e.g., SCLK signal 203) since CS value equals a zero (0) value. After block 408, decision block 412 illustrates a determination made whether a pulse of a SCLK signal (e.g., SCLK signal 203) has occurred (e.g., determine whether a set of SCLK pulses for controlling ADC 100 is being input at SCLK pin). If such a SCLK pulse has not occurred at decision block 412, state machine method 400 iterates at decision block 412.

On the other hand, if such a SCLK pulse has occurred, then state machine method 400 proceeds to block 414, which illustrates the FSM STATE being incremented to a next state (e.g., FSM STATE incremented by one (1)). FSM STATE is incremented each time a SCLK pulse occurs. Following block 414, decision block 416 shows a determination made whether FSM STATE of state machine 306 has reached state 8, which is the pre-designated state signifying the FSM STATE for possibly activating or triggering ADC 100 into the sleep mode. If state 8 has not been reached, then state machine method 400 returns to decision block 412 and continues therefrom to go through additional states as state machine 306 detects other SCLK pulses. However, if FSM STATE of state machine 306 has reached state 8, then state machine method 400 proceeds from decision block 416 to decision block 418 via connector A. In other words, at decision block 416, state machine 306 determines whether other SCLK pulses from SCLK signal (e.g., SCLK signal 203) occur until FSM STATE of state machine 306 has reached state 8. Referring to FIG. 5, state machine 306 moves from initial state 0 and goes through states "1" to "8" by repeating the operations in blocks 412 to 416. When state machine 306 reaches state 8, then state machine 306 moves onto the operation in block 418.

Decision block 418 shows state machine method 400 determining whether another SCLK pulse of SCLK signal (e.g., SCLK signal 203) has occurred. If another SCLK pulse has not occurred at decision block 418, state machine method 400 proceeds to decision block 419. Decision block 419 shows a determination being made as to whether state machine 306 has received a high DONE pulse (DONE SIGNAL=1) in DONE SIGNAL (e.g., DONE signal 205) from digital block 108. The high DONE pulse indicates that digital block 108 has finished converting data. If such a high DONE pulse has not been received at decision block 419, then state machine method 400 returns to decision block 418 and continues therefrom. On the other hand, if such a high DONE pulse has been received at decision block 419, state machine method 400 proceeds to blocks 420 to 430. Block 420 shows SLEEP value being set to a one (1) value since, as stated earlier, both the conditions of state machine 306 reaching predetermined state 8 (e.g., the eighth SCLK pulse of sleep set 204 has occurred) and a high DONE pulse (e.g., high DONE pulse 207D) for DONE SIGNAL (e.g., DONE SIGNAL=1) occurring signifies and triggers an indication of ADC 100 entering the sleep mode.

Normally, if the user is not reading data from ADC 100, the conditions of state machine 306 being at state 0 (since no SCLK signal would be provided) and a high or low DONE SIGNAL (e.g., DONE SIGNAL equal to one (1)) being received would occur. If the user is reading data normally from ADC 100, the conditions of state machine 306 going through state 8 and a low DONE SIGNAL being maintained would occur. Block 420 further depicts ADC 100 being powered down into the sleep mode when the conditions of SLEEP value equal to one and FSM STATE being at state 8 are satisfied. FIG. 5 further illustrates this determination at predetermined state 8 of state machine 306, which shows SLEEP value being set to one when serial data interface 118 receives a high DONE SIGNAL (e.g., high DONE pulse in DONE SIGNAL).

Following block 420, decision block 422 illustrates state machine 306 determining whether another SCLK pulse has later occurred. If at decision block 422 another SCLK pulse has not later occurred, then state machine method 400 iterates at decision block 422 until another SCLK pulse does later occur. In the meantime, ADC 100 is maintained in the sleep mode. When another SCLK pulse does later occur, state machine method 400 moves from decision block 422 to block 424, which shows state machine method 400 incrementing the FSM STATE of state machine 306 by one (1). In FIG. 5, FSM STATE would be incremented from state 8 to state 9. After block 424, decision block 426 depicts state machine method 400 determining whether FSM STATE has reached state 15, which signifies state machine 306 reaching the next predetermined state (e.g., state 15) just before the following state (e.g., state 16) for possibly powering up ADC 100 from the sleep mode. If next predetermined state 15 has not been reached at decision block 426, then state machine method 400 returns to decision block 422 and continues therefrom to go through additional states as state machine 306 detects other SCLK pulses of SCLK signal. However, if state 15 has been reached at decision block 426, then state machine method 400 proceeds from decision block 426 to block 428. In other words, at decision block 422, state machine method 400 determines whether other SCLK pulses from SCLK signal 203 later occur until state machine 306 has reached state 15. Referring to FIG. 5, FSM STATE of state machine 306 goes through states 9 to 15 by repeating the operations in blocks 422 to 426. When FSM STATE of state machine 306 reaches state 15, then state machine method 400 moves onto block 428.

Block 428 depicts state machine method 400 waiting for a next SCLK pulse (e.g., eighth pulse of wake-up set 206) to occur. When the next SCLK pulse occurs, state machine method 400 moves from block 428 to block 430, which represents state machine 306 changing the SLEEP value from the one value to a zero value. Block 430 further depicts ADC 100 waking up from the sleep mode. Block 430 shows ADC 100 being signaled to wake up from the sleep mode when FSM STATE of state machine 306 has reached the predetermined state 15, the next SCLK pulse has occurred, and the SLEEP value equals one. FIG. 5 shows the determination made at state 15 of state machine 306. In other words, if SLEEP value equals one and predetermined state 15 of state machine 306 has been reached, then state machine 306 resets by returning to state 0 when the last SCLK pulse (e.g., eighth SCLK pulse) among the wake-up set 206 occurs. After block 430, state machine method 400 resets when state machine 306 receives the last SCLK pulse among the wakeup set 206. State machine method 400 resets by returning to start block 402 via connector B since ADC 100 has just been woken up from the sleep mode.

However, if at decision block 418 another SCLK pulse has occurred, then state machine method 400 proceeds to blocks 432 to 440. Block 432 shows state machine method 400 incrementing the FSM STATE to a next state (e.g., FSM STATE incremented by one (1)). Following block 432, decision block 434 depicts state machine method 400 determining whether FSM STATE of state machine 306 has reached state 31, which would signify state machine 306 reaching the next to last state before the end the processing and outputting of the converted data through SDO signal via SDO pin. If state 31 has not been reached at decision block 434, then state machine method 400 proceeds to decision block 436. Decision block 436 represents a determination whether another SCLK pulse has occurred. If another SCLK pulse has not occurred at decision block 436, state machine method 400 iterates thereat until another SCLK pulse occurs. When another SCLK pulse occurs at decision block 436, then state machine method 400 proceeds to block 438, which shows the FSM STATE of state machine 306 being incremented to the next state (e.g., FSM STATE incremented by one (1)). State machine method 400 then returns to decision block 434 via connector C and continues therefrom.

However, if the FSM STATE of state machine 306 has reached state 31 at decision block 434, then state machine method 400 proceeds to block 440. Block 440 shows state machine method 400 waiting for a next SCLK pulse (e.g., the thirty-second SCLK pulse among normal set 202) to occur. When the next SCLK pulse occurs at block 440, state machine method 400 automatically resets by returning back to start block 402 via connector B. Therefore, ADC 100 continues to operate in the normal operational mode in providing converted data to the user even when FSM STATE has reached state 8, a high DONE SIGNAL has not been received, and the SLEEP value is a low value. ADC 100 continues to process and output the data from state 9 to 31 and automatically resets to state 0 when the thirty-second SCLK pulse occurs (also see FIG. 5).

Figure 6:
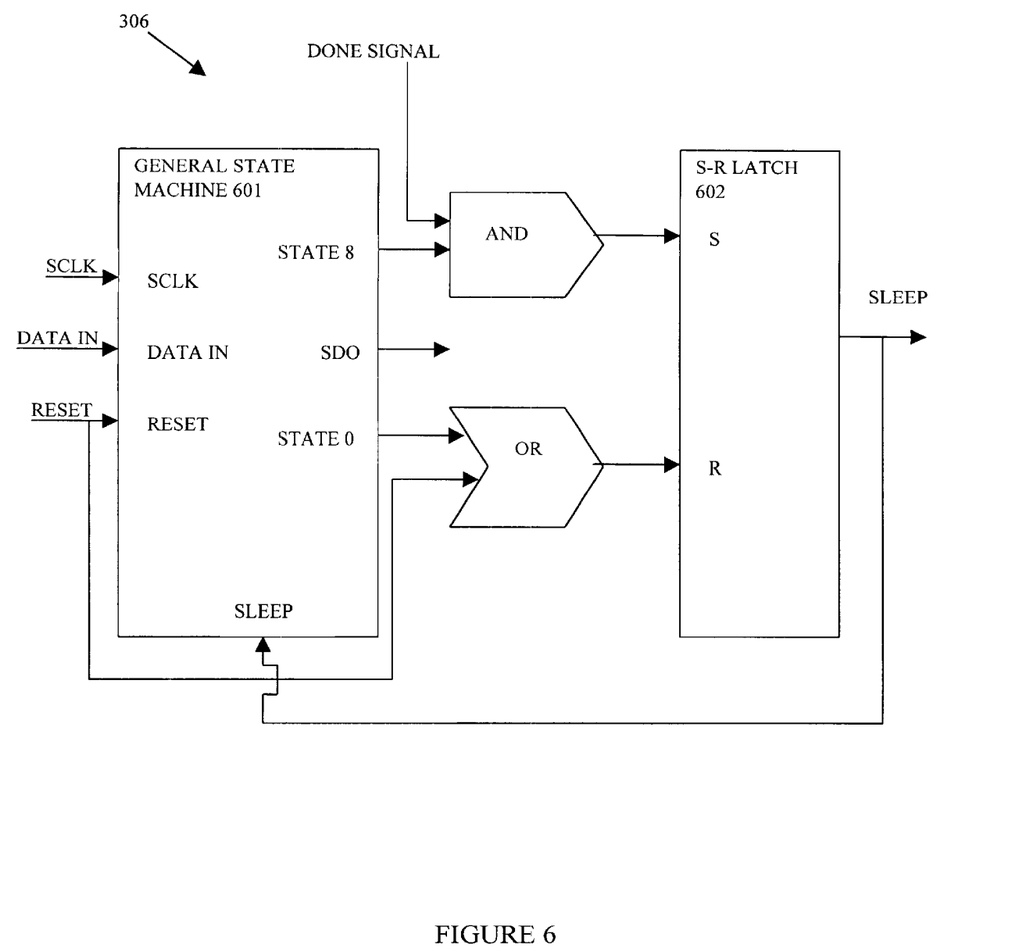
FIG. 6 is a logical hardware block diagram for implementing the present invention.

FIG. 6 shows a logical hardware block diagram for state machine 306 for implementing the present invention. The logical block diagram shows state machine 306 with a general state machine 601. General state machine 601 receives SCLK signal, DATA IN signal, and a RESET signal via respective SCLK pin, DATA IN pin, and RESET pin. State machine 306 determines whether state 8 has been reached and a high DONE SIGNAL has been received. The AND gate receives high signals as to when state 8 has been reached and a high DONE SIGNAL has been received. Otherwise, low signals are respectively received at these inputs. The AND gate generates a high signal to the set latch (S latch) of S-R latch 602, and the high signal of the S-R latch 602 provides a high SLEEP value (e.g., SLEEP=1) when these two conditions of state 8 being reached and a high DONE SIGNAL being received occur. SLEEP value is the output of S-R latch 602. SLEEP value is fed back to the general state machine 601 via the SLEEP pin. SLEEP value remains high until it is set back low when either state machine 306 returns to state 0 according to state machine method 400 or a RESET command is triggered at the reset latch (R latch) of S-R latch 602. The RESET occurrence is shown where the OR gate receives state 0 and the RESET signal that is also being input via the RESET pin.

ADC 100 may be used in various applications such as analog-to-digital conversion in temperature sensing devices, weight determining devices, measuring instruments, audio applications, recording studio equipment, telecommunication systems and devices, and any other suitable applications.

The present invention discloses a method and system for powering down an analog-to-digital converter ("ADC") into a sleep mode. The present invention discloses that if the ADC receives a normal set of pulses for a serial clock signal of the ADC, a serial interface controller outputs in a normal fashion converted data requested by a user through a serial interface. The present invention further discloses that if the ADC receives a sleep set of pulses for the serial clock signal, a state machine of the ADC powers down the ADC into a sleep mode in which at least parts of the ADC are operated at a reduced power consumption level. The present invention furthermore discloses that if the ADC is in the sleep mode and the ADC receives a wake-up set of pulses for the serial clock signal, the state machine powers back up the ADC from the sleep mode. The present invention does not require a separate pin on the ADC circuitry for switching between powering down and powering up the ADC. The present invention also provides a system and method for selectively powering down each individual chip among multiple chips connected to the same power source.

The present invention is not in any way limited to being implemented within any specific ADC, serial data interface, serial interface controller, or state machine or by using any particular ADC component, device, or sub-system, and the present invention may be implemented within any suitable system and/or by using any suitable component, device, or system.

While the invention has been particularly shown and described with reference to a preferred embodiment, it will be understood by those skilled in the art that various changes in form and detail may be made therein without departing from the spirit and scope of the invention.

What is claimed is:

1. A method for powering down an analog-to-digital converter ("ADC") into a sleep mode, comprising the steps of:

in response to an analog-to-digital converter ("ADC") receiving a normal set of serial clock pulses, outputting, by a serial interface controller, converted data requested by a user through a serial interface;

in response to the ADC receiving a sleep set of serial clock pulses powering down, by a state machine of the ADC, the ADC into a sleep mode in which at least parts of the ADC are operated at a reduced power consumption level; and in response to the ADC being in the sleep mode and the ADC receiving a wake-up set of serial clock pulses, powering up, by the state machine, the ADC from the sleep mode; and wherein a serial clock signal of the ADC provides either the normal set of serial clock pulses, the sleep set of serial clock pulses or the wake-up set of serial clock pulses and the state machine distinguishes which one of the three sets of serial clock pulses is being provided by the serial clock signal.

2. The method according to claim 1, further comprising the steps of:

determining the ADC receiving the sleep set of serial clock pulses by initializing a state of the state machine to a zero state, incrementing the state by one as each of the pulses is received, determining whether a predetermined state of the state machine has been reached and the serial interface controller has received a high done signal from a digital block of the ADC signifying completion of data conversion; and in response to the state machine reaching the predetermined state and the serial interface controller receiving the high done signal, changing, by the state machine, a sleep value to a high value, which signifies the ADC to enter the sleep mode.

3. The method according to claim 2, further comprising the steps of:

determining the ADC receiving the wake-up set of serial clock pulses only after the ADC has entered into the sleep mode by further incrementing the state by one as each of other pulses is received and determining whether another predetermined state of the state machine has been reached; and in response to the state machine reaching the another predetermined state and the sleep value is at the high value, changing, by the state machine, the sleep value from the high value back to the low value, which signifies the ADC to wake up from the sleep mode and resetting the state to the zero state.

4. The method according to claim 2 further comprising the steps of:

determining the ADC receiving the normal set of serial clock pulses by further incrementing the state by one as each of other pulses is received and determining whether the predetermined state of the state machine has been reached and the serial interface controller has not received the high done signal; and in response to the state machine reaching the predetermined state and the serial interface controller not receiving the high done signal, maintaining, by the state machine, the sleep value to a low value signifying the ADO to operate in a normal mode until a final pulse of the normal set of serial clock pulses has been received.

5. The method according to claim 4, further comprising the step of:

resetting the state to the zero state and restarting execution of the method steps after the ADC operates in the normal mode and finishes outputting the converted data requested by the user and after the state machine receives the final pulse of the normal set of serial clock pulses.

6. The method according to claim 1, further comprising the step of:

idling the ADC, by the state machine, if a signal is not provided as the serial clock signal.

7. The method according to claim 1, wherein a state of the state machine is defined for powering down the ADC Into the sleep mode.

8. The method according to claim 1, wherein:

the normal set of serial clock pulses determines and indicates operating the ADC in a normal mode;

the sleep set of serial clock pulses determines and indicates powering down the ADC into a sleep mode; and the wake-up set of serial clock pulses determines and indicates waking up the ADC from the sleep mode and operating the ADC in the normal mode.

9. A serial interface controller for an analog-to-digital converter ("ADC") having a digital system and an analog system wherein the serial interface controller allows a serial device to be coupled to the ADC and the serial interface controller controls the ADC in a normal mode or a sleep mode, comprising:

a state machine having components coupled together in a manner to provide serial interface control operations which include:

in response to the ADC receiving a normal set of serial clock pulses the serial interface controller outputs converted data requested by a user through a serial interface;

in response to the ADC receiving a sleep set of serial clock pulses the state machine powers down the ADC into a sleep mode in which at least parts of the ADC are operated at a reduced power consumption level; and in response to the ADC being in the sleep mode and the ADC receiving a wake-up set of serial clock pulses, the state machine powers up the ADC from the sleep mode; and wherein a serial clock signal of the ADC provides either the normal set of serial clock pulses, the sleep set of serial clock pulses, or the wake-up set of serial clock pulses and the state machine distinguishes which one of the three sets of serial clock pulses is being provided by the serial clock signal.

10. The serial interface controller according to claim 9, wherein the components provide the serial interface control operations that further comprise:

the ADC determines receipt of the sleep set of serial clock pulses by initializing a state of the state machine to a zero state, incrementing the state by one as each of the pulses is received, determining whether a predetermined state of the state machine has been reached and the serial interface controller has received a high done signal from a digital block of the ADC signifying completion of data conversion; and in response to the state machine reaching the predetermined state and the serial interface controller receiving the high done signal, the state machine changes a sleep value to a high value signifying the ADC to enter the sleep mode.

11. The serial interface controller according to claim 10, wherein the components provide the serial interface control operations that further comprise:

the ADC determines receipt of the wake-up set of serial clock purses only after the ADC has entered into the sleep mode by further incrementing the state by one as each of other pulses is received and determining whether another predetermined state of the state machine has been reached; and in response to the state machine reaching the another predetermined state, the state machine changes the sleep value from the high value back to the low value signifying the ADC to wake up from the sleep mode and the state machine resets the state to the zero state.

12. The serial interface controller according to claim 10 wherein the components provide the serial interface control operations that further comprise:

the ADC determines receipt of the normal set of serial clock pulses by further incrementing the state by one as each of other pulses is received and determining whether the predetermined state of the state machine has been reached and the serial interface controller has not received the high done signal; and in response to the state machine reaching the predetermined state and the serial interface controller not receiving the high done signal, the state machine maintains the sleep value to a low value signifying the ADC operating in a normal mode until a final pulse of the normal set of serial clock pulses has been received.

13. The serial interface controller according to claim 12, wherein the components provide the serial interface control operations that further comprise:

the ADC resets the state to the zero state and restarts execution after operating in the normal mode and finishes outputting the converted data requested by the user after the state machine receives the final pulse of the normal set of serial clock pulses.

14. The serial interface controller according to claim 9, wherein the components provide the serial interface control operations that further comprise:

the state machine idles the ADC if a signal is not provided as the serial clock signal.

15. The serial interface controller according to claim 9, wherein a state of the state machine is defined for powering down the ADC into the sleep mode.

16. The serial interface controller according to claim 9, wherein:

the normal set of serial clock pulses determines and indicates operating the ADC in a normal mode;

the sleep set of serial clock pulses determines and indicates powering down the ADC into a sleep mode; and the wake-up set of serial clock pulses determines and indicates waking up the ADC from the sleep mode and operating the ADC in the normal mode.

17. An analog-to-digital converter ("ADC") for converting analog signals to digital signals, comprising:
- an analog system having a modulator for processing and converting analog signals to digital signals; and
- a digital system coupled to the analog system wherein the digital system processes and outputs the digital signals;
- wherein the digital system has a digital logic system, a clock generator, a filter, and a serial port block coupled to each other wherein the serial port block further comprises a serial data interface with a serial interface controller which allows a serial device to be coupled to the ADC and the serial interface controller controls the ADC in a normal mode or a sleep mode, and
- wherein the serial interface controller comprises a state machine having components coupled together in a manner to provide serial interface control operations which include:
  - in response to the ADC receiving a normal set of serial clock pulses, the serial interface controller outputs converted data requested by a user through a serial interface;
  - in response to the ADC receiving a sleep set of serial clock pulses, the state machine powers down the ADC into a sleep mode in which at least parts of the ADC are operated at a reduced power consumption level; and
  - in response to the ADC being in the sleep mode and the ADC receiving a wake-up set of serial clock pulses, the state machine powers up the ADC from the sleep mode; and
  - wherein a serial clock signal of the ADC provides either the normal set of serial clock pulses, the sleep set of serial clock pulses, or the wake-us set of serial clock pulses and the state machine distinguishes which one of the three sets of serial clock pulses is being provided by the serial clock signal.

18. The ADC according to claim 17, wherein the components provide the serial interface control operations that further comprise:
- the ADC determines receipt of the sleep set of serial clock pulses by initializing a state of the state machine to a zero state, incrementing the state by one as each of the pulses is received, determining whether a predetermined state of the state machine has been reached and the serial interface controller has received a high done signal from a digital block of the ADO signifying completion of data conversion; and
- in response to the state machine reaching the predetermined state and the serial interface controller receiving the high done signal, the state machine changes a sleep value to a high value signifying the ADC to enter the sleep mode.

19. The ADC according to claim 18, wherein the components provide the serial interface control operations that further comprise:
- the ADC determines receipt of the wake-up set of serial clock pulses only after the ADC has entered into the sleep mode by further incrementing the state by one as each of other pulses is received and determining whether another predetermined state of the state machine has been reached; and
- in response to the state machine reaching the another predetermined state, the state machine changes the sleep value from the high value back to the low value signifying the ADC to wake up from the sleep mode and the state machine resets the state to the zero state.

20. The ADC according to claim 18 wherein the components provide the serial Interface control operations that further comprise:
- the ADC determines receipt of the normal set of serial clock pulses by further incrementing the state by one as each of other pulses is received and determining whether the predetermined state of the state machine has been reached and the serial interface controller has not received the high done signal; and
- in response to the state machine reaching the predetermined state and the serial interface controller not receiving the high done signal, the state machine maintains the sleep value to a low value signifying the ADC operating in a normal mode until a final pulse of the normal set of serial clock pulses has been received.

21. The ADC according to claim 20, wherein the components provide the serial interface control operations that further comprise:
- the ADC resets the state to the zero state and restarts execution after operating in the normal mode and finishes outputting the converted data requested by the user after the state machine receives the final pulse of the normal set of serial clock pulses.

22. The ADC according to claim 17, wherein the components provide the serial interface control operations that further comprise:
- the state machine idles the ADC if a signal is not provided as the serial clock signal.

23. The ADC according to claim 17, wherein a state of the state machine is defined for powering down the ADC into the sleep mode.

24. The ADC according to claim 17, wherein:
- the normal set of serial clock pulses determines and indicates operating the ADC in a normal mode;
- the sleep set of serial dock pulses determines and indicates powering down the ADC into a sleep mode; and
- the wake-up set of serial clock pulses determines and indicates waking up the ADC from the sleep mode and operating the ADC in the normal mode.

25. A method of utilizing a serial clock signal for controlling an analog-to-digital converter between a normal operational mode and a sleep mode, comprising the steps of:
- sending a sleep clock signal to indicate an analog-to-digital converter ("ADC") to power down into a sleep mode;
- when the ADC is in the sleep mode, sending a wake up signal to indicate the ADC to power up from the sleep mode; and
- sending a normal clock signal to indicate the ADC to convert and output data in a normal operational mode; and
- wherein a serial clock signal provides either the sleep clock signal, the wake up signal, or the normal clock signal.

26. The method according to claim 25, further comprising the steps of:
- intializing a sleep value to a low value wherein the sleep value set to a high value signifies the ADC to enter the sleep mode and the sleep value set to a low value signifies the ADC to operate in a normal mode;
- initializing a state of a state machine of the ADC to a zero state;
- incrementing the state by one as each pulse of the serial clock signal is received;
- determining the serial clock signal has sent the sleep clock signal by determining whether the state machine has reached a predetermined state and a serial interface of the ADC has received a high done signal from a digital block of the ADC;

when the ADC is in the sleep mode, determining the serial clock signal has sent the wake up signal by determining whether the state machine has reached another predetermined state and the sleep value is equal to a high value; and determining the serial clock signal has sent the normal clock signal by determining whether the state machine has reached the predetermined state and the high done signal has not been received from the digital block by the serial interface.

27. The method according to claim 25, further comprising:

distinguishing, by a state machine, which one of the sleep clock signal, the wake up signal, or the normal clock signal is being provided by the serial clock signal.

28. The method according to claim 26, wherein:

the normal clock signal is a normal set of serial clock pulses which determines and indicates operating the ADC in the normal operational mode;

the sleep clock signal is a sleep set of serial clock pulses which determines and indicates powering down the ADC into a sleep mode; and the wake up signal is a wake-up set of pulses which determines and indicates waking up the ADC from the sleep mode and operating the ADC in the normal operational mode.

* * * * *